United States Patent
Epperson et al.

(10) Patent No.: US 6,701,138 B2
(45) Date of Patent: Mar. 2, 2004

(54) POWER AMPLIFIER CONTROL

(75) Inventors: Darrell Epperson, Oak Ridge, NC (US); Leendert Quist, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 366 days.

(21) Appl. No.: 09/878,461

(22) Filed: Jun. 11, 2001

(65) Prior Publication Data

US 2003/0040343 A1 Feb. 27, 2003

(51) Int. Cl.$^7$ ................................................ H04B 1/04
(52) U.S. Cl. ...................... 455/127; 455/126; 455/572; 330/133
(58) Field of Search ............................... 455/127, 126, 455/232.1, 74, 91, 572, 115, 114, 127.1, 127.3; 330/277, 285, 296, 310, 133, 51, 129; 606/37; 375/297, 130

(56) References Cited

U.S. PATENT DOCUMENTS

| | | | | |
|---|---|---|---|---|
| 4,739,759 A | | 4/1988 | Rexroth et al. ......... 128/303.14 |
| 5,204,637 A | * | 4/1993 | Trinh ......................... 330/129 |
| 5,251,330 A | | 10/1993 | Chiba et al. ................. 455/91 |
| 5,276,917 A | * | 1/1994 | Vanhanen et al. .......... 455/553 |
| 5,438,683 A | | 8/1995 | Durtler et al. ................ 455/74 |
| 5,442,322 A | * | 8/1995 | Kornfeld et al. ............ 330/285 |
| 5,493,255 A | | 2/1996 | Murtojarvi .................. 330/296 |
| 5,511,234 A | | 4/1996 | Ha .............................. 455/127 |
| 5,553,318 A | * | 9/1996 | Ohmagari et al. .......... 455/126 |
| 5,559,471 A | * | 9/1996 | Black ......................... 330/277 |
| 5,561,395 A | * | 10/1996 | Melton et al. ................. 330/2 |
| 5,574,991 A | * | 11/1996 | Miyama et al. ............. 455/126 |
| 5,606,284 A | * | 2/1997 | Tamesue et al. ............ 330/129 |
| 5,621,354 A | * | 4/1997 | Mitzlaff ....................... 330/52 |
| 5,715,527 A | | 2/1998 | Horii et al. .................. 455/126 |
| 5,831,477 A | * | 11/1998 | Tsumura ...................... 330/51 |
| 5,942,946 A | | 8/1999 | Su et al. ...................... 330/310 |
| 5,994,963 A | | 11/1999 | Kawai et al. ................ 330/277 |
| 6,025,753 A | | 2/2000 | Landherr et al. ............ 330/285 |
| 6,049,704 A | | 4/2000 | Peckham et al. ......... 455/232.1 |
| 6,069,530 A | * | 5/2000 | Clark ........................... 330/149 |
| 6,148,220 A | * | 11/2000 | Sharp et al. ................. 455/572 |
| 6,327,462 B1 | | 12/2001 | Loke et al. .................. 455/127 |
| 6,356,745 B1 | | 3/2002 | Lee et al. .................. 455/232.1 |
| 6,369,649 B2 | | 4/2002 | Nakajima ..................... 330/51 |
| 6,374,127 B1 | | 4/2002 | Park ........................... 455/572 |
| 6,397,090 B1 | | 5/2002 | Cho ............................ 455/574 |
| 6,405,054 B1 | | 6/2002 | Rozenblit et al. ........... 455/522 |
| 2001/0006355 A1 | | 7/2001 | Park ........................... 330/285 |
| 2002/0002038 A1 | | 1/2002 | Seawright et al. .......... 455/127 |
| 2002/0077066 A1 | | 6/2002 | Pehlke et al. ................. 455/73 |
| 2002/0127980 A1 | | 9/2002 | Amanullah et al. ......... 455/127 |
| 2003/0083026 A1 | | 5/2003 | Liu ............................. 455/127 |
| 2003/0090325 A1 | | 5/2003 | Canyon et al. ............. 330/285 |

FOREIGN PATENT DOCUMENTS

| JP | 61095603 | 5/1986 | ............ H03G/3/10 |
|---|---|---|---|
| JP | 5235657 | 9/1993 | ............ H03F/3/22 |

* cited by examiner

*Primary Examiner*—Charles Appiah
(74) *Attorney, Agent, or Firm*—Winthrow & Terranova, PLLC

(57) ABSTRACT

The present invention provides for power amplifier control of amplifier circuitry including an input stage and one or more output stages. The input stage is powered separately from the output stage by a relatively fixed power source. The one or more output stages are supplied with power via a voltage regulator having a controllable output voltage. A closed loop control integrated with the amplifier stages forces the voltage output of the voltage regulator to track the profile of an adjustable control signal, such as $V_{RAMP}$.

12 Claims, 6 Drawing Sheets

POWER AMPLIFIER CONTROL

BACKGROUND OF THE INVENTION (1) Field of the Invention

The present invention relates to controlling the output power of a multistage radio frequency power amplifier by adjusting the power supply voltage level applied to the final stages of the power amplifier.

(2) Description of the Prior Art

In recent years, worldwide demand for wireless cellular communications has increased dramatically. Radiotelephones manufactured to meet this burgeoning demand must adhere to standards such as the Global System for Mobile Communications (GSM) standard. Another standard, the Digital Cellular System (DCS) standard is based on GSM, but is directed towards higher cell density and lower power. A third standard, Personal Communications Services (PCS), is a "catch all" for many digital cellular systems, including GSM, operating in North America. These standards all require precise output power control over a large dynamic range in order to prevent a transmitter located in one cell from interfering with the reception of transmissions from other transmitters in neighboring cells.

A key component common to all radiotelephones is a radio frequency (RF) power amplifier. In modern digital radiotelephones, power amplifiers receive as input a frequency or phase modulated radio frequency carrier. The radio frequency carrier is what "carries" digital information such as digitized voice or data to a cellular base station. Before reaching the power amplifier, the RF carrier is too weak to be received by a cellular base station. Therefore it is the function of the power amplifier to boost the power of the RF carrier to a level sufficient for reception by a cellular base station.

Unfortunately, a simple single fixed power level will not work within a cellular network. Mobile users transmitting while traveling through multiple cells at a single fixed high power setting would overwhelm several cellular base stations. In contrast, a mobile user transmitting at a low power setting would result in unreliable short-range communication with perhaps a single cellular base station. To overcome this problem, engineers have designed radiotelephones with power amplifiers having multiple adjustably selectable power levels.

Accurately and efficiently selecting and controlling output power delivered by an RF amplifier remains a formidable task. For example, prior art systems sample output power by diverting a portion of their output power through the use of expensive components such as directional couplers. The diverted power is wasted, resulting in inefficiency reducing battery life and talk time.

Furthermore, most prior art systems also detect the RF power sample with a peak power diode detector circuit used to rectify and sense forward power. Through the rectification process, there is some squaring of the shape of the output power waveform. This squaring leads to higher harmonic content. The higher harmonic content requires additional and costly filtering because harmonic frequencies must be suppressed in order to comply with international communication regulations. Beyond detection, various other components are employed to compare a reference power level to the detected RF power sample. These components include buffers, attenuators, and passives, such as resistors.

Ultimately, a bias control circuit adjusts the gain of several amplifier stages to adjust the output power to an appropriate level. Generally, prior art bias control circuits involve substantial complexity due to large variations in power control loop bandwidth. Most often, prior art power control systems dedicate costly Application Specific Integrated Circuits (ASICs) to provide complex bias adjustments necessary to hold selected discrete power levels.

Another problem faced by conventional amplifier architectures is that of power control loop stability. In prior art systems, the gain varies widely across different power levels. It is common to find gain varying tenfold on a decibel scale over a full range of power levels. Amplifier gain is often referred to as control slope when considered as a control variable.

Whenever a power control signal, commonly referred to as an adjustable power control signal or APC, is applied to bias control circuitry, a given amplifier gain should be established for a given APC voltage. Unfortunately, highly nonlinear control slopes inherent in prior art systems are constantly changing due to external influences such as power supply fluctuations, temperature variations and output load changes. As a result of highly nonlinear and inconsistent control slope, it is difficult to design the proper control loop bandwidth to maintain control loop stability over all control slope regions. This results in increased design cycles, resulting in increased time to market.

In GSM radiotelephones, the adjustable power control signal must comply with a specification known as a "burst mask." The burst mask specifies the rise time, fall time, duration, and power levels associated with the adjustable power control signal. The GSM signal consists of eight equal time slots. Each time slot must conform to the burst mask specification. Telephone software generates, by way of a digital-to-analog converter, an adjustable power control signal referred to as $V_{RAMP}$. The ramp up time and ramp down time of $V_{RAMP}$ must conform to the shape of the burst mask. The amplitude of $V_{RAMP}$ dictates output power.

Yet another problem common to the prior art is that of inconsistent burst timing caused by input power fluctuations due to variations of temperature and power supply voltage. Burst timing is delayed with a decrease in input power and advanced with an increase in input power. Prior art systems use software to attempt to correct this problem, causing valuable code space to be consumed as a result.

Still another problem manifests itself in the prior art due to undesirable switching transients that occur when the up and down ramp of the burst is not smooth or changes shape. These switching transients also occur if the control slope of the amplifier has an inflection point within the output range, or if the slope is very steep. Consequently, it is difficult for a prior art system to change bias and gain in such a way as to prevent switching transients.

Thus, there remains a need for a power amplifier module with power loop control eliminating the need for traditional designs, which incorporate directional couplers, detector diodes, and power control ASICs, along with the problems associated with the employment of such devices.

SUMMARY OF THE INVENTION

The present invention provides for power amplifier control of amplifier circuitry including an input stage and one or more output stages. The input stage is powered separately from the output stage by a relatively fixed power source. The one or more output stages are supplied with power via a voltage regulator having a controllable output voltage. A closed loop control integrated with the amplifier stages forces the voltage output of the voltage regulator to track the profile of an adjustable control signal, such as $V_{RAMP}$.

The closed loop control preferably includes an error amplifier, a feedback network, and a linear voltage regulator. The error amplifier compares a sample of regulator output voltage, scaled by the feedback network, with the voltage of the adjustable control signal. The voltage difference between the sampled voltage and the control voltage signal is amplified by the error amplifier and applied as a control signal for the voltage regulator. The control loop bandwidth is preferably high enough that for all practical purposes the voltage regulator instantaneously adjusts its output such that the voltage applied to the collector of the output amplifier stage corresponds to the control signal. Preferably, intermediate amplifier stages, which are series connected between the input and output stages, are supplied with power by way of the same voltage regulator controlled by the control loop.

Other aspects of the invention will become apparent to one skilled in the art upon a reading of the following detailed description of the invention, taken with the drawings.

BRIEF DESCRIPTION OF THE DRAWINGS

The accompanying drawing figures incorporated in and forming a part of this specification illustrate several aspects of the invention, and together with the description serve to explain the principles of the invention.

DESCRIPTION OF THE PREFERRED EMBODIMENT

Accurate and discrete power control can be achieved by varying the dc voltage supplied to the collectors or drains of the final amplifier stages of a power amplifier. As opposed to the prior art, radio frequency (RF) output power for the present invention has very little dependence on frequency, temperature, or input power when the supply voltage for the final amplifier stages is regulated to control output power. Adjusting the supply voltage rather than adjusting the bias of the amplifier stages results in smooth predictable control over the full range of power. The circuitry used to implement the invention may be incorporated into a single semiconductor or may comprise multiple discrete components.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
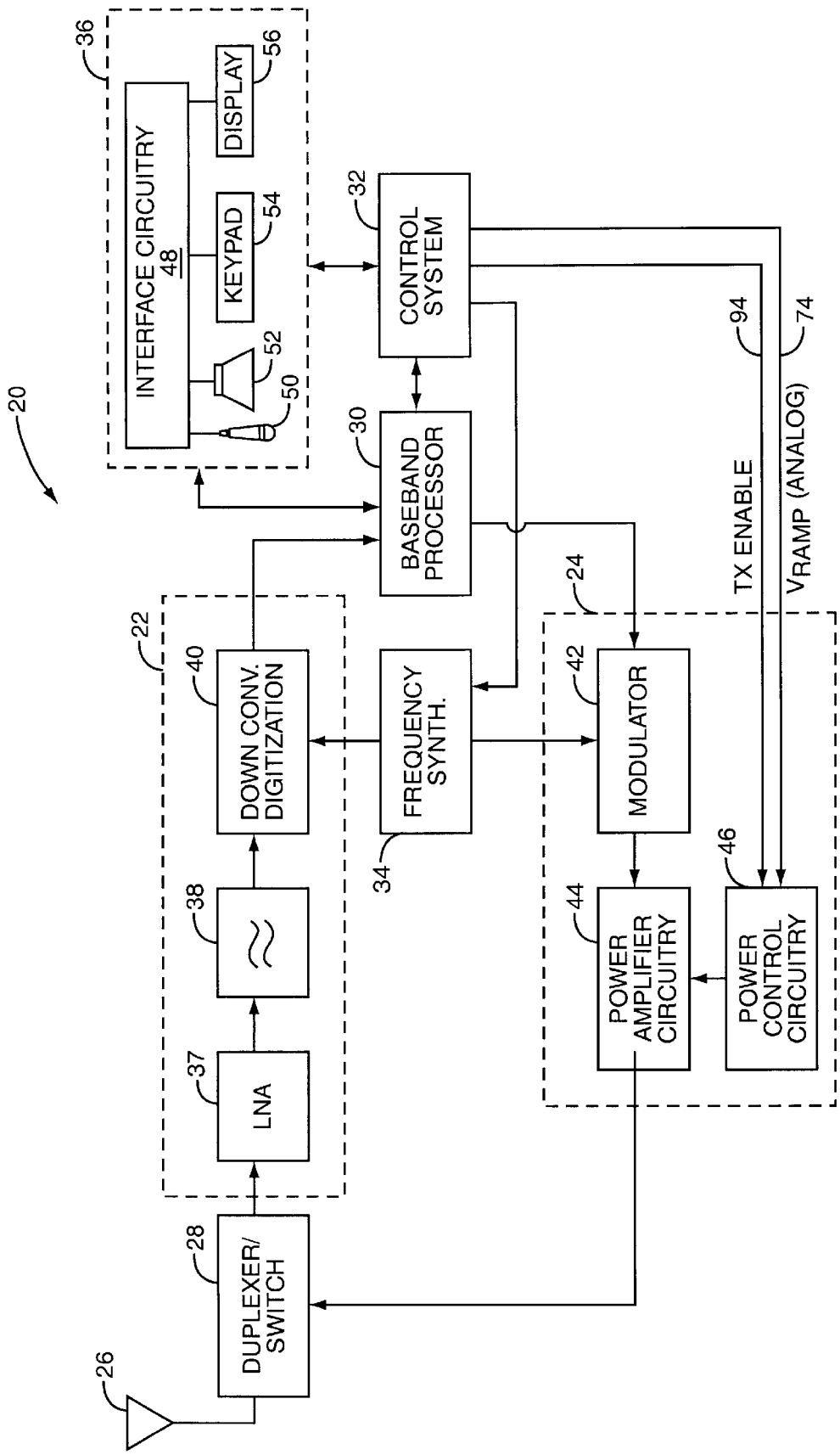
FIG. 1 is a schematic of a mobile terminal constructed according to the present invention.

The present invention is preferably incorporated in a mobile terminal 20, such a mobile telephone, personal digital assistant, or the like. The basic architecture of a mobile terminal 20 is represented in FIG. 1 and may include a receiver front end 22, a radio frequency transmitter section 24, an antenna 26, a duplexer or switch 28, a baseband processor 30, a control system 32, a frequency synthesizer 34, and an interface 36. The receiver front end 22 receives information bearing radio frequency signals from one or more remote transmitters provided by a base station. A low noise amplifier 37 amplifies the signal. A filter circuit 38 minimizes broadband interference in the received signal, while a downconverter 40 downconverts the filtered, received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data from the control system 32, which it encodes for transmission. The encoded data is output to the transmitter 24, where it is used by a modulator 42 to modulate a carrier signal that is at a desired transmit frequency. Power amplifier circuitry 44 amplifies the modulated carrier signal to a level appropriate for transmission from the antenna 26.

As described in further detail below, the power amplifier circuitry 44 provides gain for the signal to be transmitted under control of the power control circuitry 46, which is preferably controlled by the control system 32 using the $V_{RAMP}$ signal 74. Preferably, the bias for the amplifier circuitry 44 is relatively stable regardless of power, and varying the voltage supplied to the amplifier circuitry 44 controls actual power levels. The control system 32 may also provide a transmit enable (TX ENABLE) 94 to effectively turn the power amplifier circuitry 44 and power control circuitry 46 on during periods of transmission.

A user may interact with the mobile terminal 20 via the interface 36, which may include interface circuitry 48 associated with a microphone 50, a speaker 52, a keypad 54, and a display 56. The interface circuitry 48 typically includes analog-to-digital converters, digital-to-analog converters, amplifiers, and the like. Additionally, it may include a voice encoder/decoder, in which case it may communicate directly with the baseband processor 30.

The microphone 50 will typically convert audio input, such as the user's voice, into an electrical signal, which is then digitized and passed directly or indirectly to the baseband processor 30. Audio information encoded in the received signal is recovered by the baseband processor 30, and converted into an analog signal suitable for driving speaker 52 by the I/O and interface circuitry 48. The keypad 54 and display 56 enable the user to interact with the mobile terminal 20, input numbers to be dialed, address book information, or the like, as well as monitor call progress information.

Figure 2:
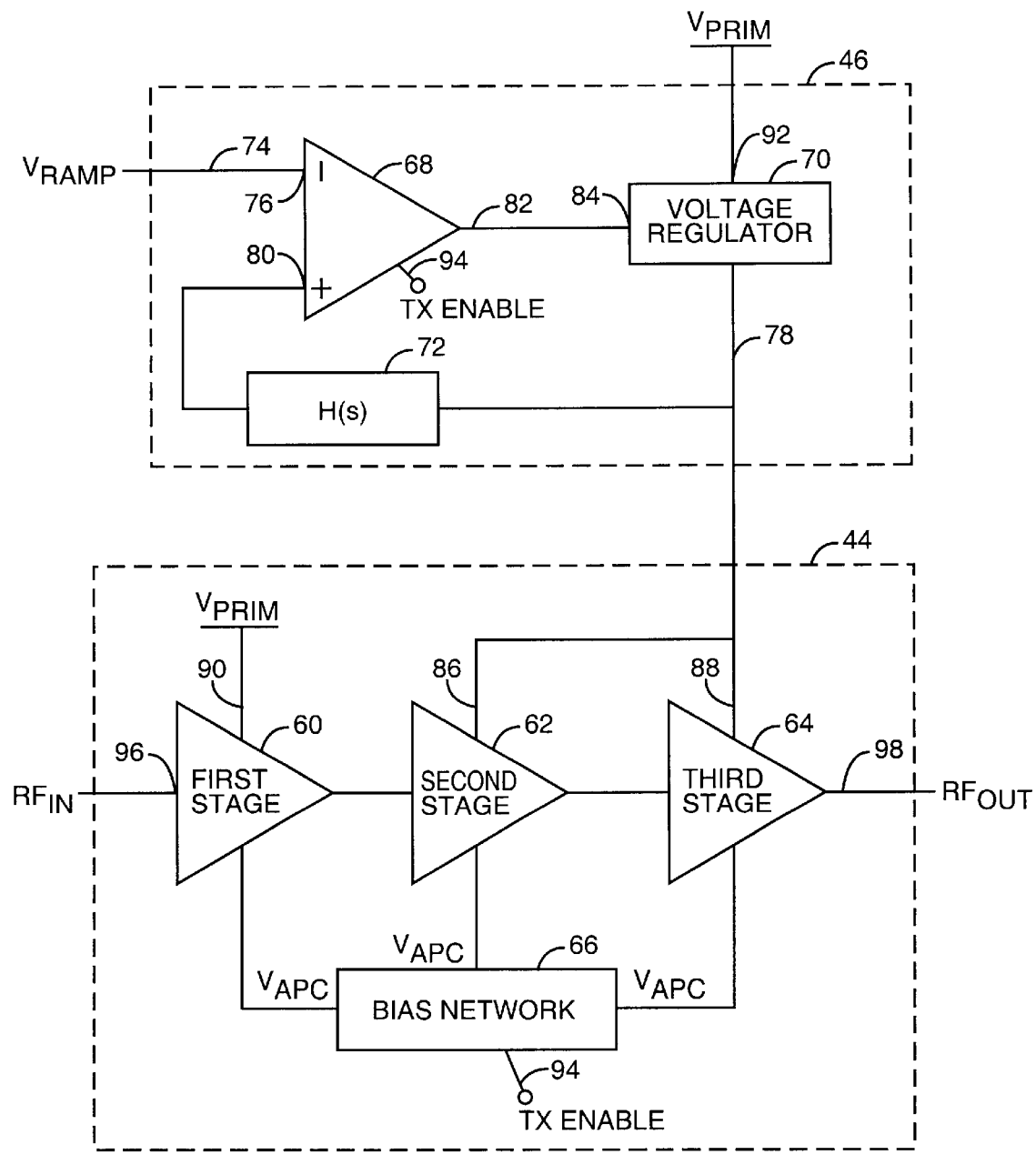
FIG. 2 is a circuit diagram depicting the preferred embodiment of the present invention.

Turning now to FIG. 2, the power amplifier circuitry 44 is associated with power control circuitry 46. The power amplifier circuitry 44 primarily includes three amplifier stages, a first amplifier stage 60, a second amplifier stage 62, and a third amplifier stage 64, as well as a bias network 66 providing bias for each of the three amplifier stages 60, 62, and 64. The power control circuitry 46 will preferably include an error amplifier 68, a voltage regulator 70, and a feedback network 72.

An adjustable power control signal 74 ($V_{RAMP}$) may be received by a negative input 76 of an operational amplifier forming error amplifier 68. The output 78 of the voltage regulator 70 is fed back through the feedback network 72 and received by positive input 80 of error amplifier 68. An output signal 82 from error amplifier 68 is provided to a control input 84 of the voltage regulator 70 that controls the regulated output 78 of voltage regulator 70. The voltage regulator 70 regulates the voltage supplied to the rails 86, 88 of the second and third amplifier stages 62, 64, respectively. These rails 86, 88 will typically be the collectors or drains of bipolar or field effect transistors forming the respective amplifier stages, as will be appreciated by those skilled in the art.

The rail 90 of first amplifier stage 60 is connected directly to a fixed or primary voltage supply $V_{PRIM}$, which will preferably also be connected to the terminal for the positive potential of a battery. $V_{PRIM}$ is also preferably connected to voltage regulator input terminal 92. As noted, the bias network 66 preferably supplies a fixed bias to the three power amplifier stages 60, 62, 64, regardless of the collector/drain voltage supplied to the second and third amplifier stages 62, 64. The fixed bias incorporates traditional $V_{APC}$ signals, which are configured to maintain a constant bias.

A transmitter control signal 94, TX ENABLE, is a logic signal used to simultaneously enable or disable the error amplifier 68 and the amplifier circuitry 44, by removing the bias from each of the three amplifier stages 60, 62, 64. A radio frequency signal to be amplified ($RF_{IN}$) is provided at the input 96 of the first stage amplifier 60 and amplified by the three amplifier stages 60, 62, 64 to provide an amplified output signal 98 ($RF_{OUT}$) from the third amplifier stage 64.

Figure 3:
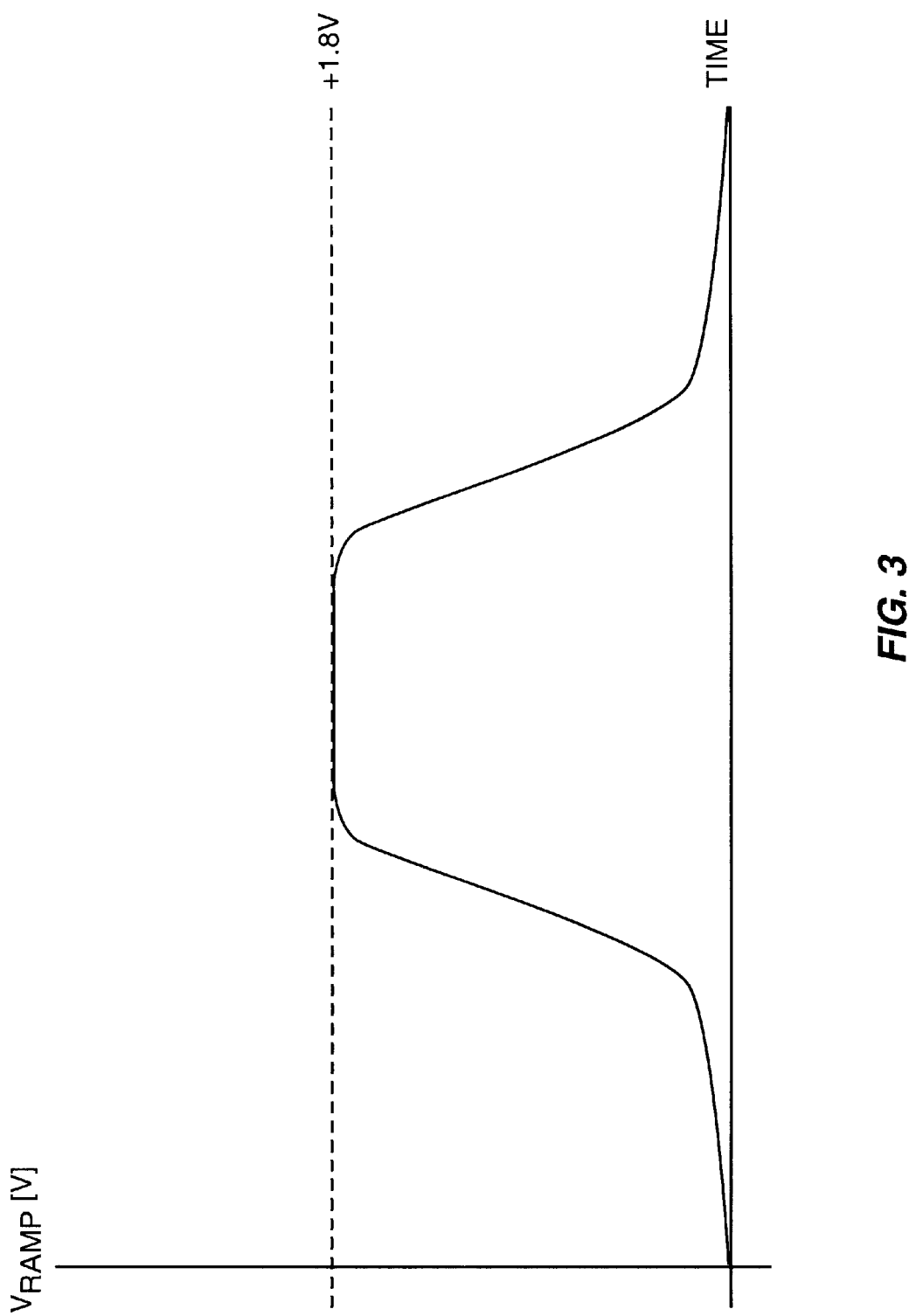
FIG. 3 is a graph that depicts the profile of the adjustable power control signal $V_{RAMP}$.
Figure 4:
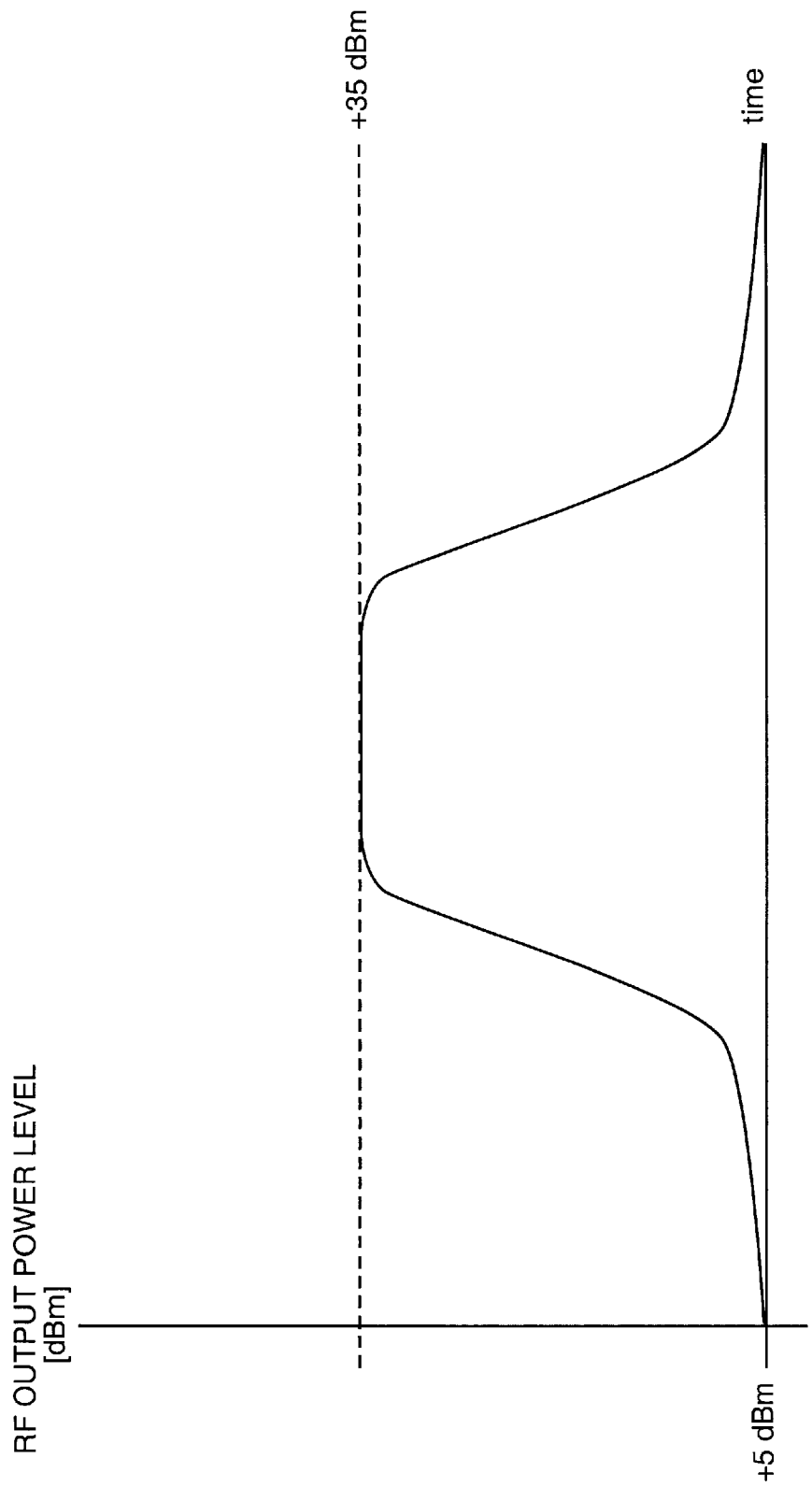
FIG. 4 is a graph depicting the relationship between output power and the $V_{RAMP}$ adjustable power control signal.

The voltage profile of a typical $V_{RAMP}$ signal is shown in FIG. 3. The current embodiment of the invention limits the $V_{RAMP}$ signal to +1.8V, however other embodiments of the invention may use less or more voltage to drive the $V_{RAMP}$ input. Turning now to FIG. 4, the output power level as a function of the $V_{RAMP}$ signal of FIG. 3 is illustrated. Notably, the power level tracks the $V_{RAMP}$ signal and ranges from +5 dBm at the minimum to +35 dBm at the maximum for the preferred embodiment.

Figure 5:
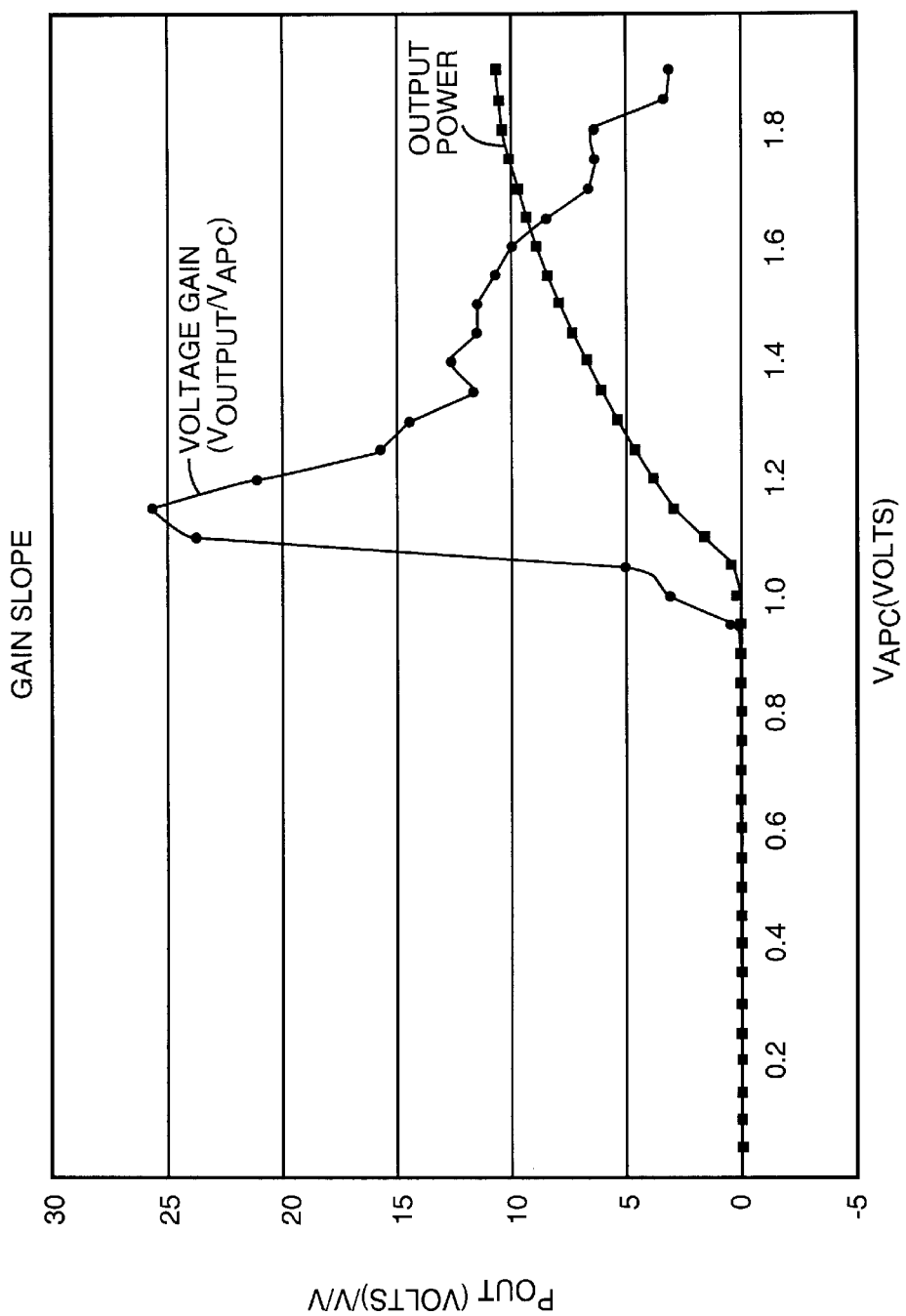
FIG. 5 is a graph showing power amplifier gain, also known as control slope, for conventional prior art architecture.

FIG. 5 illustrates the non-linear relationship between an adjustable power control signal ($V_{APC}$), which typically controls bias to traditional amplifier circuitry of the prior art, and output power. Voltage gain is represented by the ratio of the RF output voltage to the power control signal of the amplifier circuitry. The available output voltage of the amplifier circuitry corresponds to the output power.

Figure 6:
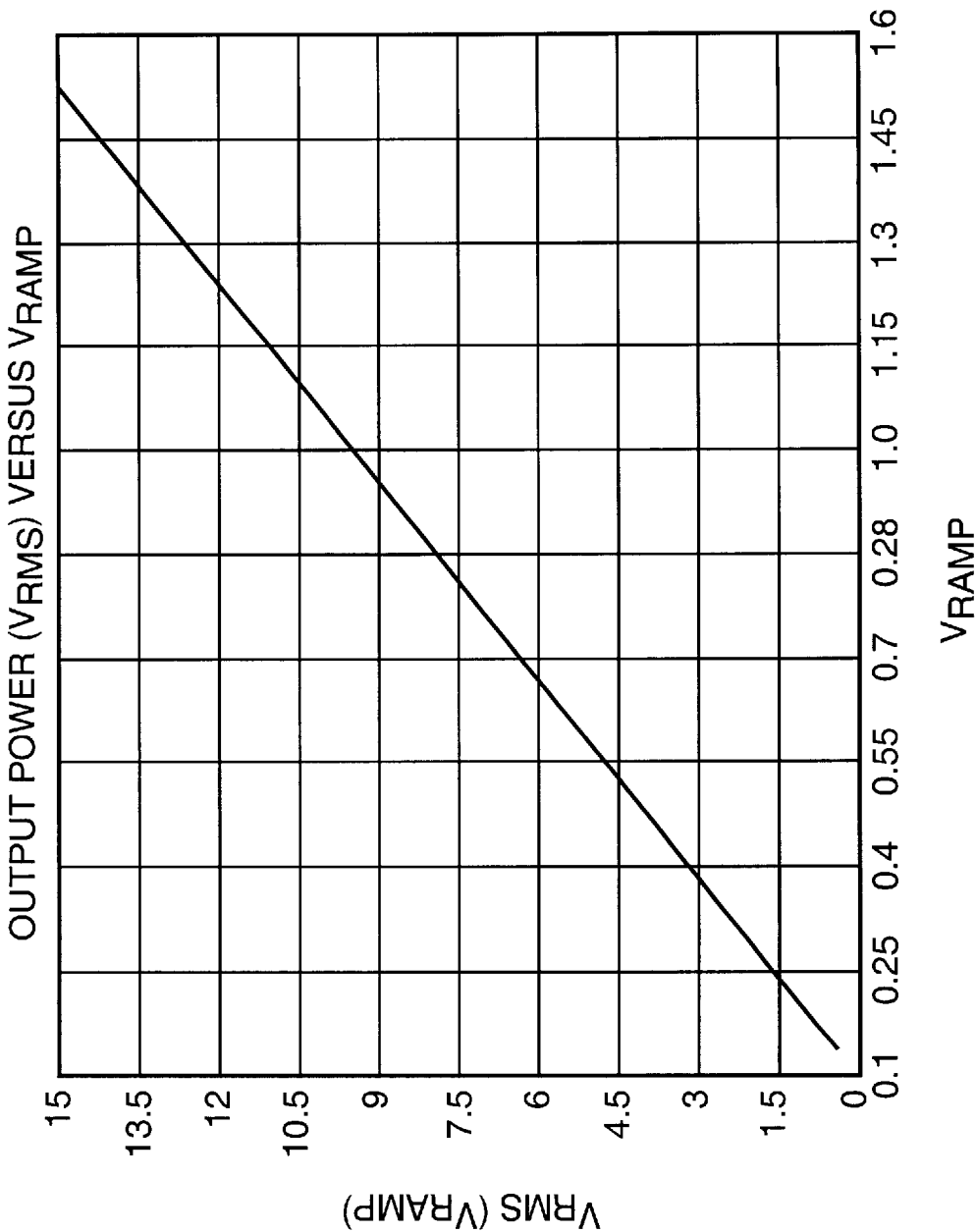
FIG. 6 is a graph showing the control slope for the present invention.

In contrast, FIG. 6 illustrates the linear relationship between $V_{RAMP}$, which is used to control gain in the present invention, and the actual output power. The present invention presents a much smaller variance in slope, eliminating loop stability problems and the non-linear gain control characteristics. Furthermore, the loop bandwidth is determined only by internal bandwidth and RF output load, therefore, loop bandwidth does not change with respect to an output power level.

The present invention preferably incorporates an indirect closed loop voltage regulator to control the power transmitted by a triple-band GSM/DCS/PCS power amplifier module. The indirectness of the closed loop makes the method of control essentially invisible to third party design engineers. This simplifies phone design by eliminating the need for lengthy and complicated control loop design. Indeed, the indirect closed loop appears as an open loop to the user, and can be driven directly from the output of a digital to analog converter.

Most prior art GSM power control systems either detect forward power or sense collector/drain current. The present invention does not use a power detector; instead, a high-speed control may be incorporated to regulate collector or drain voltages applied to the output stages of the amplifier, while the input stage is held at constant bias.

By regulating power delivered, the output stages are held in saturation across all power levels. Prior art control systems are unable to keep output stages saturated throughout all power levels. As power levels decrease from full power to zero, the collector or drain voltage applied to the output stages is decreased. The relationship of output power versus collector voltage can be seen in Equation 1.

$$P_{dBm} = 10 \cdot \log\left[\frac{(2 \cdot V_{CC} - V_{SAT})^2}{8 \cdot R_{LOAD} \cdot 10^{-3}}\right] \quad (Eq.1)$$

Talk time and power management are key concerns in transmitter design, since power amplifiers account for the highest current draw in a mobile radiotelephone. Considering only the power amplifier's efficiency does not provide a true assessment of total system efficiency. Effective efficiency must be considered. Effective efficiency factors in the loss between the power amplifier and antenna, and is a much better figure of merit for evaluating power management and talk time. Effective efficiency can be calculated with Equation 2, which follows.

$$\eta_{EFF} = \frac{\sum_{n=1}^{m} P_N - P_{IN}}{P_{DC}} \cdot 100 \quad (Eq.2)$$

Where $P_N$ is the sum of all positive and negative RF power, $P_{IN}$ is the input power and $P_{DC}$ is the delivered DC power. In decibels the formula becomes Equation 3.

$$\eta_{EFF} = \frac{10^{\frac{P_{PA}+P_{LOSS}}{10}} - 10^{\frac{P_{IN}}{10}}}{V_{BAT} \cdot I_{BAT} \cdot 10} \quad (Eq.3)$$

Where $P_{PA}$ is the output power from the power amplifier, $P_{LOSS}$ is insertion loss, $P_{IN}$ is input power to the power amplifier, $V_{BAT}$ is the battery or source voltage and $I_{BAT}$ is the battery or source current.

The present invention improves the effective efficiency by minimizing the PLOSS term in Equation 3. A directional coupler may introduce 0.4 dB to 0.5 dB insertion loss in the transmit path. Consider the effective efficiency improvement provided by the present invention as demonstrated by the following example:

| VALUE | PRIOR ART | PRESENT INVENTION |
|---|---|---|
| $P_{PA}$ | +33 dBm | +33 dBm |
| $P_{IN}$ | +6 dBm | +6 dBm |
| $P_{LOSS}$ | −0.4 dB | 0 dB |
| $V_{BAT}$ | 3.5 V | 3.5 V |

| VALUE | PRIOR ART | PRESENT INVENTION |
|---|---|---|
| $I_{BAT}$ | 1.1 A | 1.1 A |
| $\eta_{EFF}$ | 47.2% | 51.7% |

In this example, the present invention improves efficiency by almost 5%.

With the present invention, output power does not vary due to supply voltage under normal operating conditions providing $V_{RAMP}$ is sufficiently lower than the source or battery voltage. Regulating the rail voltage applied to the final amplifier stages practically eliminates voltage sensitivity.

Typically, $V_{RAMP}$ will be sufficiently less than the source voltage; however, as the source voltage gets lower due to battery discharge and approaches its lower power range, the maximum output power from the power amplifier will drop slightly. In this case, it is important to also decrease $V_{RAMP}$ to prevent the power control loop from inducing switching transients. These switching transients occur as a result of the control loop slowing down and not regulating power as a function of $V_{RAMP}$. Compensating software controls switching transients due to low battery conditions for the extreme relationship covered by Equation 4.

$$V_{RAMP} \leq 0.375 \cdot V_{cc} + 0.18 \quad \text{(Eq. 4)}$$

Components coupled to the output of a power amplifier often have insertion losses that vary with respect to frequency. Heretofore, third party design engineers have to consider these variations. Due to their sensitivity to changes in frequency, directional couplers and detector diodes create design constraints. Additional design constraints result in increased design time. Fortunately, the present invention does not need directional couplers or detector diodes to control power effectively.

Input impedance variation is found in most GSM power amplifiers. This is due to the variations in base-emitter and collector-base capacitance with respect to bias voltage. This can present a problem in some prior art designs by pulling the transmit voltage controlled oscillator (VCO) off frequency. This problem cannot exist in the present invention, because the bias point of the first or input amplifier stage 60 is held constant. This presents a constant load to the VCO.

Noise power is often a problem when backing off power in prior art power amplifiers. The reason for this is that changing bias voltages changes the gain in all stages, and according to the noise formula as represented by Equation 5, the noise figure depends on the noise factor and gain in all stages. As an improvement over the prior art, the present invention always keeps the gain to the first amplifier stage 60 constant and high, therefore the overall noise power is not increased when decreasing output power.

$$F_{TOT} = F1 + \frac{F2-1}{G1} + \frac{F3-1}{G1 \cdot G2} \quad \text{(Eq.5)}$$

Additionally, the second and third amplifier stages 62, 64 are preferably kept in saturation over all power levels. This prevents gain expansion at decreasing output power and consequently avoids the problem of increasing noise at reduced power levels.

Power control circuitry stability often presents many challenges to transmitter design. Designing power control circuitry 46 involves engineering trade-offs affecting stability, transient spectrum, and burst timing. In prior art systems the power amplifier gain, also referred to as control slope, varies across different power levels, and as a result loop bandwidth also varies. With some power amplifiers it is possible for control slope, measured in decibels per volt, to change tenfold. The challenge presented in designing mobile terminals 20 incorporating prior art power amplifiers is keeping the loop bandwidth wide enough to meet burst mask specifications in low control slope regions, while at the same time maintaining stability in high control slope regions.

The present invention's control loop bandwidth is determined only by internal bandwidth and RF output load. Loop bandwidth does not change with respect to power levels, because bias voltage does not vary, making it easier to maintain loop stability with a high bandwidth loop.

With prior art power amplifiers, burst timing is affected when the input power from the VCO changes due to variations in temperature or supply voltage. At low VCO power levels, the burst timing will be delayed, requiring compensation by software. Code written to compensate for burst timing delays takes up valuable code space that could otherwise be used for additional phone features, or the like. The present invention is insensitive to changes in input power as a result of constant bias applied to the first amplifier stage 60; therefore, burst timing is constant and requires no compensation.

In the preferred embodiment, a simple CMOS voltage regulator with an on-resistance of less than 50 milliohms is used to adjust the voltage to the second and third amplifier stages 62, 64. Using a voltage regulator 70 with such low on-resistance greatly limits the efficiency drop at full power. Furthermore, the voltage to the input or first amplifier stage 60 of the amplifier circuitry 44 is unregulated in the preferred embodiment. Not varying the rail 90 for the first amplifier stage 60 leads to a lesser effect on noise figure, as well as more constant input impedance.

Switching transients is another problem inherent in the prior art. Switching transients may occur when the rise and fall of the burst is not smooth. They may also result from inflection points sometimes present within the output power range. The steepness of the control slope itself can also make it difficult to prevent switching transients. The present invention prevents switching transients by constantly biasing all power amplifier stages.

Undesirable harmonic frequencies are unavoidable products of high efficiency power amplifier design. An ideal class "F" saturated power amplifier will produce a perfect square wave. Unfortunately, a square wave has high harmonic content. This problem is compounded in prior art systems by the use of peak power diodes used to rectify and sense forward power. The present invention addresses this problem by eliminating the need for a peak power diode. This is accomplished by eliminating most of the external components of traditional designs used to control output power, including a power control ASIC, direction coupler, buffers, attenuators, and various passive components.

One embodiment of the present invention includes at least two amplifier stages, an input stage and an output stage. The input stage is powered separately from the output stage by a relatively fixed power source. The output stage is supplied with power by way of a voltage regulator 70 connected to a battery or some other source of dc power. A closed loop control integrated with the amplifier stages 60, 62, 64 forces the voltage output of the voltage regulator 70 to track the profile of the adjustable control signal 74, such as $V_{RAMP}$.

The closed loop control includes an error amplifier 68, a voltage feedback network, and a linear voltage regulator 70. The error amplifier 68 compares a sample of regulator output voltage, scaled by a feedback network, with the voltage of the $V_{RAMP}$ signal. The voltage difference between the sampled voltage and the $V_{RAMP}$ voltage signal is amplified by the error amplifier 68 and applied as a control signal to the control input of the voltage regulator 70. The control loop bandwidth is high enough that for all practical purposes the voltage regulator 70 instantaneously adjusts its output such that the voltage applied to the collector of the output amplifier stage is of the same profile as $V_{RAMP}$.

In another embodiment of the present invention, an intermediate amplifier stage is connected in series between the input and output stages. This intermediate stage is supplied with power by way of the same voltage regulator 70 controlled by the same control loop mentioned in the previous embodiment.

Further, a linearly controlled switching regulator may be used, which will increase the overall efficiency of the amplifier.

One benefit of the present invention is that the integrated closed loop regulation is in essence hidden from the user. In other words, because of the integration, the user can use the invention as if it had simple open loop control. As a result of this feature the present invention is much more easily implemented in mobile terminal design than the prior art allows.

Another benefit of the present invention is the simplicity of the control slope curve. The control slope of prior art systems varies greatly, making control loop stability tenuous at best for all power levels. Furthermore, the accuracy of any discrete power level is governed in part by how steep the control slope is at the region in which control is exercised.

Yet another benefit of the present invention deals with an often-overlooked problem in power amplifier control loops, the problem of delay between the adjustable power control signal and the response of changing the output power. Also, because the input stage has fixed high gain, variations in RF input power due to temperature or supply voltage variations do not cause burst timing to shift rightward in time. For these reasons, burst timing is constant in the present invention and requires no software compensation.

Another benefit of the present invention is a reduction in external parts count, yielding a substantial savings in both price and board space. The present invention does not require the use of a directional coupler or any other type of radio frequency sampler or measurement. Additionally, the present invention does not incorporate a peak power diode detector present in many power control systems found in the prior art. The lack of the peak power diode detector results in the added benefit of reducing harmonic content of the output power frequency spectrum. Moreover, the present invention can be controlled by software without having to use a costly power control ASIC interface. The reduction of active components results in a reduction of passive components such as resistors, capacitors, and inductors.

Alternative uses for the invention can be realized with a modulation technique known as log-polar modulation. Log-polar modulation consists of amplitude and phase modulation applied to separate inputs. In the case of the present invention, phase modulation is applied to the amplifier input stage and amplitude modulation is superimposed on the $V_{RAMP}$ signal.

Certain modifications and improvements will occur to those skilled in the art upon a reading of the foregoing description. Further, the present invention has been realized using particular combinations of components, i.e. resistors, capacitors, inductors, transistors, and the like. It can also be appreciated that combinations of these components may be interchangeable under specific conditions dependent upon factors such as operating frequency. It should be understood that all such modifications and improvements have been deleted herein for the sake of conciseness and readability but are properly within the scope of the following claims.

What is claimed is:

1. A power amplifier configuration comprising:
   a) power control circuitry comprising:
      i) a power regulator providing an output voltage at an output node responsive to an adjustable power control signal;
      ii) an error amplifier having a first input for receiving the adjustable power control signal, a second input, and an output coupled to the power regulator to control the output voltage at the output node; and
      iii) a feedback network coupled between the output node of the power regulator and the second input of the error amplifier; and
   b) power amplifier circuitry including an input amplifier stage in series with an output amplifier stage for amplifying a radio frequency input signal, the input amplifier stage receiving power from a fixed voltage node and the output amplifier stage receiving power via the output node of the power regulator;
   wherein the adjustable power control signal is adjusted to control output power provided by the power amplifier circuitry by controlling the voltage supplied to the output amplifier stage and the output of the error amplifier is responsive to both the adjustable power control signal and a voltage signal fed back from the output node of the power regulator.

2. The power amplifier configuration comprising:
   a) power control circuitry including a power regulator providing an output voltage at an output node responsive to an adjustable power control signal; and
   b) power amplifier circuitry including an input amplifier stage in series with an output amplifier stage for amplifying a radio frequency input signal, the input amplifier stage receiving power from a fixed voltage node and the output amplifier stage receiving power via the output node of the power regulator, the power amplifier circuitry further including a second output amplifier stage between and in series with the input and output amplifier stages, the second output amplifier stage receiving power via the output node of the power regulator such that the adjustable power control signal is adjusted to control output power provided by the power amplifier circuitry by controlling the voltage supplied to the output amplifier stage and the second output amplifier stage.

3. The power amplifier configuration of claim 2 wherein the bias circuitry further provides a constant bias to the second output amplifier stage.

4. A mobile terminal comprising:
   a) a control system providing an adjustable power control signal to control output power for transmitted radio frequency signals; and
   b) communication electronics associated with the control system and comprising:
      i) power control circuitry comprising:
         A) a power regulator providing an output voltage at an output node responsive to an adjustable tower control signal;
         B) an error amplifier having a first input for receiving the adjustable power control signal, a second input, and an output coupled to the power regulator to control the output voltage at the output node; and
         C) a feedback network coupled between the output node of the power regulator and the second input of the error amplifier; and ii) power amplifier circuitry including an input amplifier stage in series with an output amplifier stage for amplifying radio frequency input signal, the input amplifier stage receiving power from a fixed voltage node and the output amplifier stage receiving power via the output node of the power regulator;

wherein the adjustable power control signal is adjusted to control output power provided by the power amplifier circuitry by controlling the voltage supplied to the output amplifier stage and the output of the error amplifier is responsive to both the adjustable power control signal and a voltage signal fed back from the output node of the power regulator.

5. A mobile terminal comprising:
   a) a control system providing an adjustable power control signal to control output power for transmitted radio frequency signals; and
   b) communication electronics associated with the control system and comprising:
      i) power control circuitry including a power regulator providing an output voltage at an output node responsive to an adjustable power control signal; and
      ii) power amplifier circuitry including an input amplifier stage in series with an output amplifier stage for amplifying a radio frequency input signal, the input amplifier stage receiving power from a fixed voltage node and the output amplifier stage receiving power via the output node of the power regulator the power amplifier circuitry further including a second output amplifier stage between and in series with the input and output amplifier stages, the second output amplifier stage receiving power via the output node of the power regulator such that die adjustable power control signal is adjusted to control output power provided by the power amplifier circuitry by controlling the voltage supplied to the output amplifier stage and the second output amplifier stage.

6. The mobile terminal of claim 5 wherein the bias circuitry further provides a constant bias to the second amplifier output stage.

7. The semiconductor implementing a power amplifier configuration comprising:
   a) power control circuitry comprising:
      i) a power regulator providing an output voltage at an output node responsive to an adjustable power control signal;
      ii) an error amplifier having a first input for receiving the adjustable power control signal, a second input, and an output coupled to the power regulator to control the output voltage at the output node; and
      iii) a feedback network coupled between the output node of the power regulator and the second input of the error amplifier; and
   b) power amplifier circuitry including an input amplifier stage in series with an output amplifier stage for amplifying a radio frequency input signal, the input amplifier stage receiving power from a fixed voltage node and the output amplifier stage receiving power via the output node of the power regulator;

wherein the adjustable power control signal is adjusted to control output power provided by the power amplifier circuitry by controlling voltage supplied to the output amplifier stage and the output of the error amplifier is responsive to both the adjustable power control signal and a voltage signal fed back from the output node of the power regulator.

8. A semiconductor implementing a power amplifier configuration comprising:
   a) power control circuitry including a power regulator providing an output voltage at an output node responsive to an adjustable power control signal; and
   b) power amplifier circuitry including an input amplifier stage in series with an output amplifier stage for amplifying a radio frequency input signal, the input amplifier stage receiving power from a fixed voltage node and the output amplifier stage receiving power via the output node of the power regulator, the power amplifier circuitry further including a second output amplifier stage between and in series with the input and output amplifier stages, the second output amplifier stage receiving power via the output node of the power regulator such that the adjustable power control signal is adjusted to control output power provided by the power amplifier circuitry by controlling voltage supplied to the output amplifier stage and the second output amplifier stage.

9. The semiconductor of claim 8 wherein the bias circuitry further provides a constant bias to the second amplifier output stage.

10. A method comprising:
    a) providing a regulated output voltage responsive to an adjustable power control
    b) providing an input amplifier state in series with an output amplifier state for amplifying a radio frequency input signal;
    c) providing power to the input amplifier stage from a fixed voltage node;
    d) providing power to the output amplifier stage via the regulated output voltage:
    e) providing feedback from the regulated output voltage; and
    f) generating a voltage control signal to control the regulated output voltage responsive to both the adjustable power control signal and feedback from the regulated output voltage;
    wherein the adjustable power control signal is adjusted to control output power provided by controlling voltage supplied to the output amplifier stage.

11. A method comprising:
    a) providing a regulated output voltage responsive to an adjustable power control signal;
    b) providing in bout amplifier stage in series with an output amplifier stage for amplifying a radio frequency input signal;
    c) providing power to the input amplifier stage from a fixed voltage node;
    d) providing power to the output amplifier stage via the regulated output voltage; and
    e) providing a second output amplifier stage between and in series with the input and output amplifier stages, the second output amplifier stage receiving power via the output node of the power regulator such that the adjustable power control signal is adjusted to control output power provided by the power amplifier circuitry by controlling voltage supplied to the output amplifier stage and the second output amplifier stage.

12. The method of claim 11 further comprising providing a constant bias to the second amplifier output stage.

* * * * *

UNITED STATES PATENT AND TRADEMARK OFFICE
CERTIFICATE OF CORRECTION

PATENT NO. : 6,701,138 B2
DATED : March 2, 2004
INVENTOR(S) : Epperson et al.

It is certified that error appears in the above-identified patent and that said Letters Patent is hereby corrected as shown below:

Column 10,
Line 28, replace "The power amplifier configuration" with -- A power amplifier configuration --.

Column 11,
Line 3, insert -- a -- between "amplifying" and "radio frequency input signal".
Line 34, replace "die" with -- the --.
Line 41, replace "The semiconductor" with -- A semiconductor --.

Column 12,
Line 27, insert -- signal; -- after "adjustable power control".
Line 28, replace "state" with -- stage --.
Line 48, replace "in bout" with -- an input --.

Signed and Sealed this

Sixth Day of July, 2004

JON W. DUDAS
*Acting Director of the United States Patent and Trademark Office*